United States Patent
Sato et al.

(10) Patent No.: US 10,431,938 B2
(45) Date of Patent: Oct. 1, 2019

(54) SHIELD SHELL AND SHIELD CONNECTOR

(71) Applicant: YAZAKI CORPORATION, Tokyo (JP)

(72) Inventors: Takahiko Sato, Shizuoka (JP); Takashi Sone, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 15/995,095

(22) Filed: May 31, 2018

(65) Prior Publication Data

US 2018/0358759 A1 Dec. 13, 2018

(30) Foreign Application Priority Data

Jun. 12, 2017 (JP) ................................. 2017-114915

(51) Int. Cl.
*H01R 9/03* (2006.01)
*H01R 13/6593* (2011.01)
(Continued)

(52) U.S. Cl.
CPC ......... *H01R 13/6593* (2013.01); *H01R 4/646* (2013.01); *H01R 13/502* (2013.01); *H01R 13/6582* (2013.01); *H01R 13/6596* (2013.01); *H01R 13/74* (2013.01); *H05K 9/0007* (2013.01); *H05K 9/0018* (2013.01); *H01R 4/18* (2013.01); *H01R 13/516* (2013.01); *H01R 13/73* (2013.01)

(58) Field of Classification Search
CPC .. H01R 13/6593; H01R 13/74; H01R 13/502; H01R 13/6582; H05K 9/0007

USPC ....................................... 439/97, 98, 607.41
See application file for complete search history.

(56) References Cited

U.S. PATENT DOCUMENTS

2009/0258540 A1* 10/2009 Kameyama .......... H01R 13/502
439/607.55
2012/0003873 A1* 1/2012 Tsuchiya .............. H01R 12/724
439/607.01
(Continued)

FOREIGN PATENT DOCUMENTS

CN 104348038 A 2/2015
CN 107533887 A 1/2018
(Continued)

OTHER PUBLICATIONS

Japanese Office Action for the related Japanese Patent Application No. 2017-114915 dated May 14, 2019.
(Continued)

*Primary Examiner* — Abdullah A Riyami
*Assistant Examiner* — Nelson R. Burgos-Guntin
(74) *Attorney, Agent, or Firm* — Kenealy Vaidya LLP

(57) ABSTRACT

A shield shell includes a housing accommodation portion and a shield member mounting portion. The shield member mounting portion is formed to be continuous to the housing accommodation portion. A shield member fixing part is provided on an outer surface of the shield member mounting portion. The shield member fixing part has an inclined shape in which a cross-section taken along an axial direction of the shield member mounting portion expands outwards from a base end side of the shield member mounting portion toward an open end side of the shield member mounting portion.

10 Claims, 5 Drawing Sheets

(51) Int. Cl.
    *H01R 13/502*     (2006.01)
    *H01R 13/6582*     (2011.01)
    *H01R 13/74*     (2006.01)
    *H05K 9/00*     (2006.01)
    *H01R 4/64*     (2006.01)
    *H01R 13/6596*     (2011.01)
    *H01R 4/18*     (2006.01)
    *H01R 13/516*     (2006.01)
    *H01R 13/73*     (2006.01)

(56) References Cited

U.S. PATENT DOCUMENTS

| | | | |
|---|---|---|---|
| 2013/0153292 A1* | 6/2013 | Adachi | B60K 28/14 |
| | | | 174/70 R |
| 2015/0044912 A1 | 2/2015 | Hashimoto et al. | |
| 2015/0155638 A1 | 6/2015 | Nagahashi | |
| 2018/0072247 A1 | 3/2018 | Nakai | |
| 2018/0358758 A1* | 12/2018 | Saito | H01R 13/502 |
| 2018/0358759 A1* | 12/2018 | Sato | H01R 13/502 |

FOREIGN PATENT DOCUMENTS

| | | |
|---|---|---|
| JP | 4-55763 U | 5/1992 |
| JP | 2013-239276 A | 11/2013 |
| JP | 2016-192317 A | 11/2016 |

OTHER PUBLICATIONS

Chinese Office Action for the related Chinese Patent Application No. 201810603166.0 dated Jul. 1, 2019.

* cited by examiner

SHIELD SHELL AND SHIELD CONNECTOR

CROSS-REFERENCES TO RELATED APPLICATIONS

This application is based on and claims priority from Japanese Patent Applications No. 2017-114915 filed on Jun. 12, 2017, the entire contents of which are incorporated herein by reference.

BACKGROUND

1. Field of the Invention

The present invention relates to a shield shell on which a shield member is mounted, and a shield connector including the shield shell.

2. Description of Related Art

JP-A-2013-239276 discloses a shield shell and a shield connector.

In a structure disclosed in FIG. 2 of JP-A-2013-239276, an inverter-side connection portion 18 and a battery-side connection portion 19 correspond to the shield connector. The inverter-side connection portion 18 and the battery-side connection portion 19 are fixed to a shield case (not illustrated). Each of the inverter-side connection portion 18 and the battery-side connection portion 19 includes a shield shell 25, a ring crimp member 26, and a terminal fitting (not illustrated) that is provided on a terminal of a conduction path 15.

The shield shell 25 includes a cylindrical connection portion 24 that is inserted into a terminal 23 of a cylindrical braid 16 (shield member). The ring crimp member 26 is a member for connecting the terminal 23 of the cylindrical braid 16 to the cylindrical connection portion 24 by being crimped, and is formed to be inserted to the outside of the terminal 23 of the cylindrical braid 16.

In the crimp connection between the terminal 23 of the cylindrical braid 16 and the cylindrical connection portion 24, recessed deformities 27 illustrated in FIGS. 2 to 4 of JP-A-2013-239276 are formed by crimping the ring crimp member 26, and the terminal 23 of the cylindrical braid 16 is pressed against the cylindrical connection portion 24 by the recessed deformities 27, thereby completing an electrical connection.

However, according to the structure, in a case where a recessed deformity is formed by crimping a crimp member, when a force with which a terminal of a shield member (corresponding to the cylindrical braid 16 in JP-A-2013-239276) is pressed against a shield member mounting portion (corresponding to the cylindrical connection portion 24 in JP-A-2013-239276) by the recessed deformity is low, a force with which the shield member is held in the shield member mounting portion may decrease.

In the above-described crimp connection state, in a case where the shield member is pulled in a direction in which the shield member is separated from the shield member mounting portion (hereinafter, referred to as "separation direction"), there is a problem in that the shield member may be removed from the shield member mounting portion.

SUMMARY

One or more embodiments provide a shield shell that would prevent a shield member from being removed from a shield member mounting portion in a case where the shield member is pulled in a separation direction, and a shield connector including the shield shell.

In accordance with one or more embodiments, a shield shell includes a housing accommodation portion and a shield member mounting portion. The shield member mounting portion is formed to be continuous to the housing accommodation portion. A shield member fixing part is provided on an outer surface of the shield member mounting portion. The shield member fixing part has an inclined shape in which a cross-section taken along an axial direction of the shield member mounting portion expands outwards from a base end side of the shield member mounting portion toward an open end side of the shield member mounting portion.

Other aspects and advantages of the invention will be apparent from the following description and the appended claims.

DETAILED DESCRIPTION

Hereinafter, a shield shell and a shield connector according to an embodiment will be described with reference to FIGS. 1 to 4.

Figure 1:
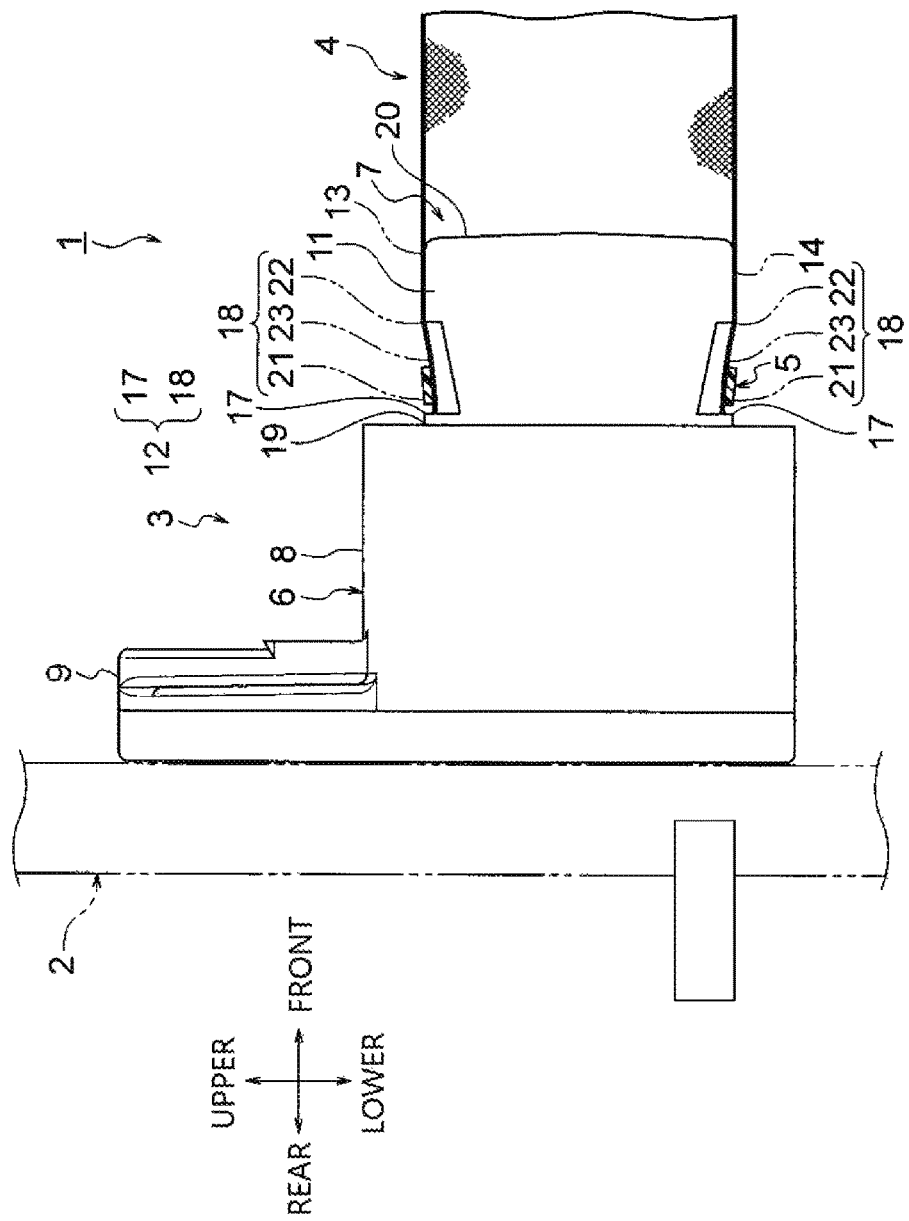
FIG. 1 is a side view illustrating an embodiment of a shield connector.
Figure 2:
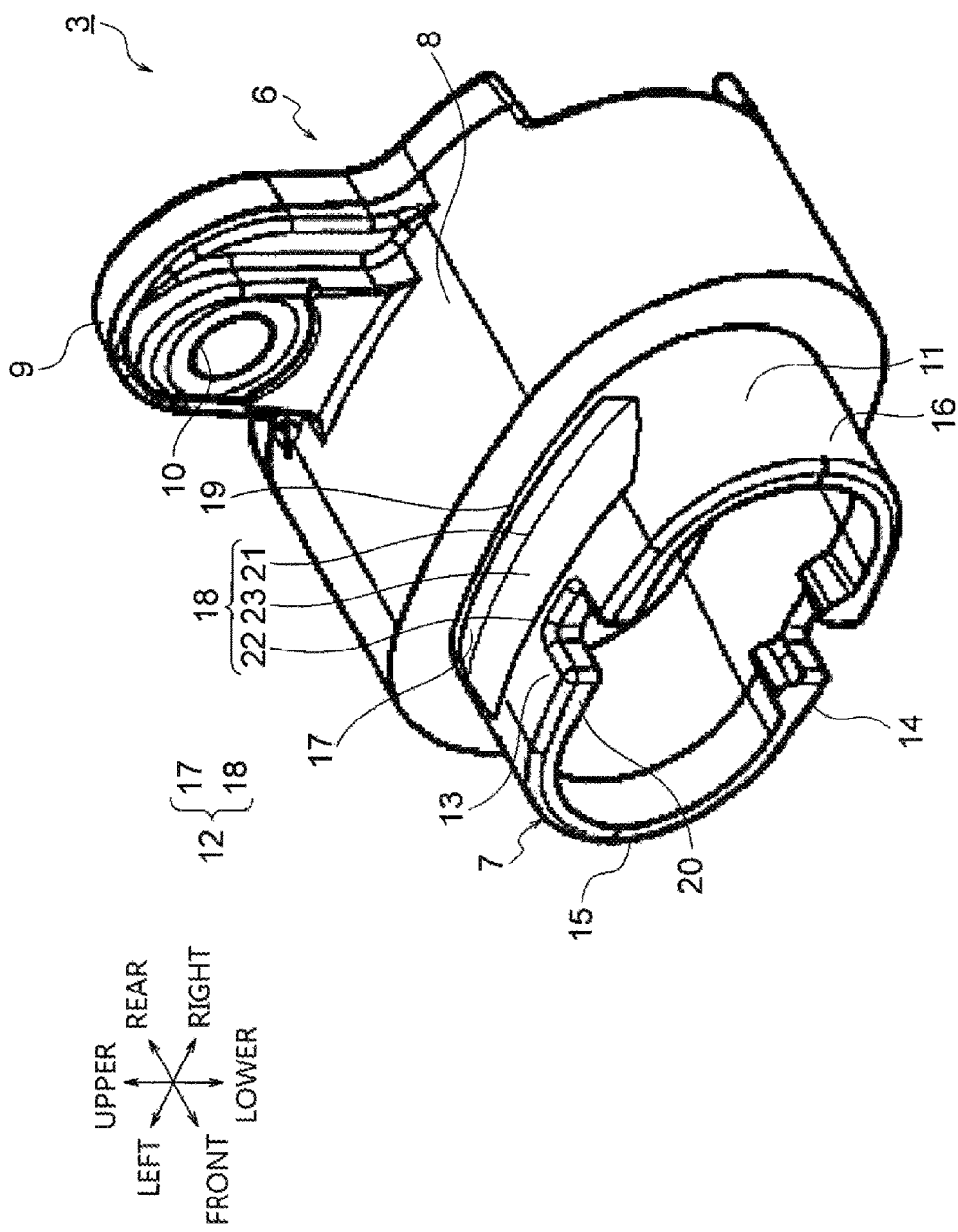
FIG. 2 is a perspective view illustrating an embodiment of a shield shell.
Figure 3:
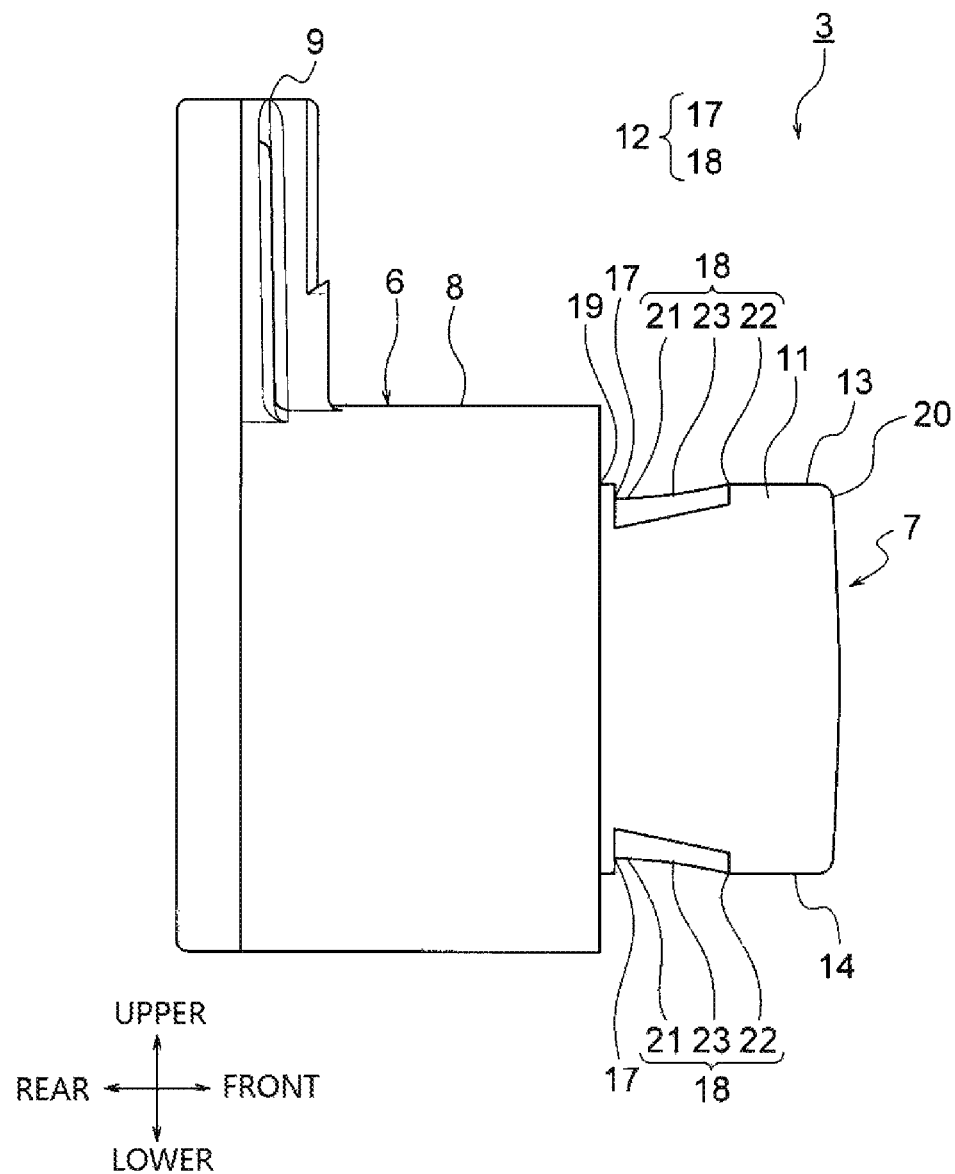
FIG. 3 is a side view illustrating the shield shell.
Figure 4:
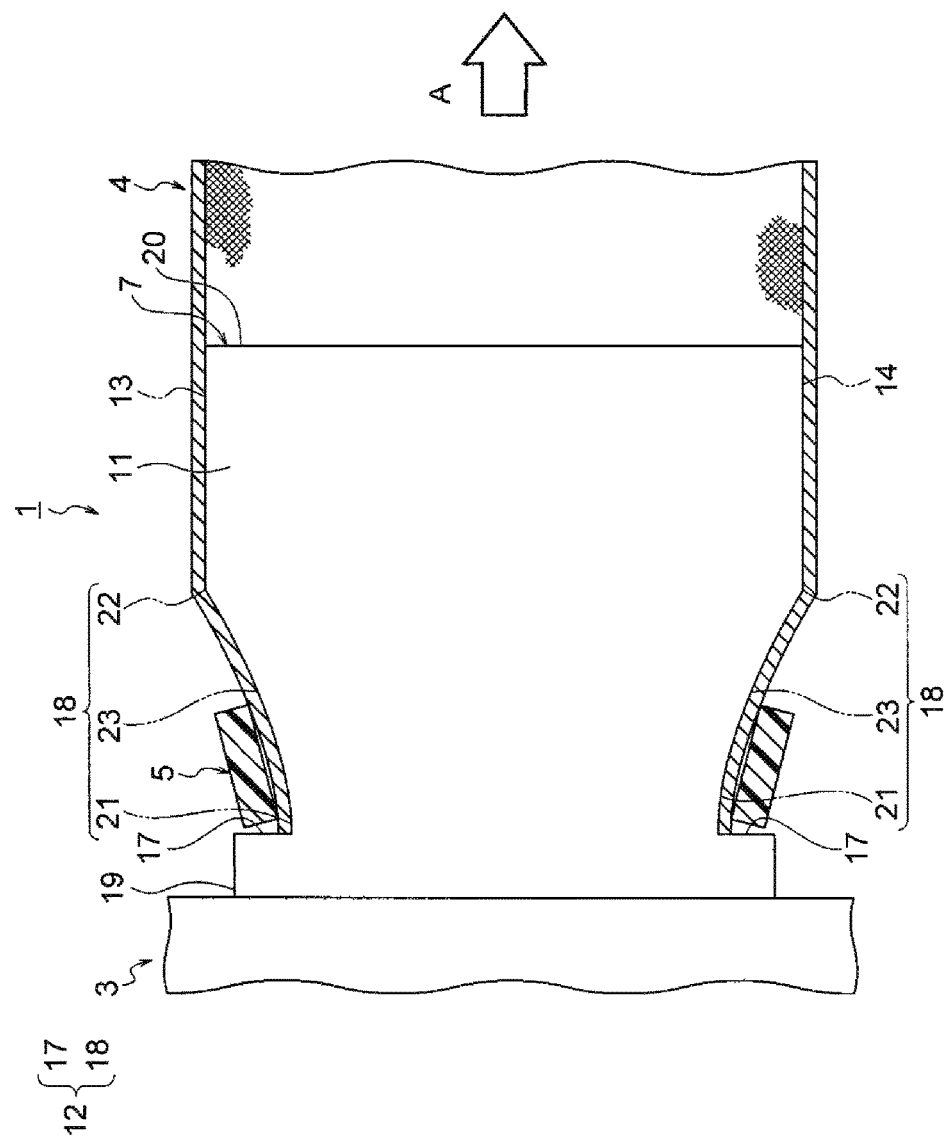
FIG. 4 is a schematic view illustrating a state where the shield member and the shield member mounting portion are fixed by a binding member.

FIG. 1 is a side view illustrating a shield connector according to an embodiment. FIG. 2 is a perspective view illustrating a shield shell according to the embodiment. FIG. 3 is a side view illustrating the shield shell. FIG. 4 is a schematic diagram illustrating a state where the shield member and the shield member mounting portion are fixed by a binding member.

In the drawings, arrows represent respective directions of upper and lower sides, left and right sides, and front and rear sides (the respective directions of the arrows are exemplary).

In FIG. 1, reference numeral 1 represents the shield connector. The shield connector 1 is not particularly limited and is electrically connected to an electrical device such as an inverter or a motor to be mounted on an electric vehicle or a hybrid vehicle when mounted on a case 2 of the electrical device.

The case 2 corresponds to "mounting target portion" in the claims and is formed of a conductive metal. The case 2 is, for example, a case of an inverter unit or a motor unit, and a grounded circuit is provided in the inverter unit or the motor unit. The case 2 is a shield case connected to the grounded circuit.

As illustrated in FIG. 1, the shield connector 1 includes a shield shell 3, a housing (not illustrated), a conduction path with terminals (not illustrated), a shield member 4, and a binding member 5. Hereinafter, each configuration of the shield connector 1 will be described.

First, the shield shell 3 will be described. The shield shell 3 illustrated in FIG. 2 is formed of a conductive metal material, and is formed in a cylindrical shape in which a cross-section taken along a direction perpendicular to an axial direction of the shield shell 3 has an elliptical shape. The shield shell 3 includes a housing accommodation portion 6 and a shield member mounting portion 7.

As illustrated in FIG. 2, the housing accommodation portion 6 is formed in a cylindrical shape in which a cross-section taken along a direction perpendicular to an axial direction of the housing accommodation portion 6 has an elliptical shape, and is formed such that the housing (not illustrated) can be accommodated therein. A shell fixing portion 9 is formed on an outer surface 8 of the housing accommodation portion 6. As illustrated in FIGS. 1 to 3, the shell fixing portion 9 is formed so as to protrude from an end (in FIG. 2, a rear end in a front-rear direction) of the outer surface 8 of the housing accommodation portion 6 that is in surface contact with the case 2. A bolt insertion hole 10 is formed in the shell fixing portion 9. The bolt insertion hole 10 is formed so as to allow insertion of a bolt (not illustrated).

As illustrated in FIGS. 1 to 3, the shield member mounting portion 7 is formed to be continuous to a front end of the housing accommodation portion 6. The shield member mounting portion 7 is formed in a cylindrical shape in which a cross-section taken along a direction perpendicular to an axial direction of the shield member mounting portion 7 has an elliptical shape. A shield member fixing part 12 is formed in an outer surface 11 of the shield member mounting portion 7.

In the embodiment, the shield member mounting portion 7 is formed in the above-described shape but is not limited thereto. In addition, the shield member mounting portion 7 is formed in a cylindrical shape in which a cross-section taken along a direction perpendicular to an axial direction of the shield member mounting portion 7 has an oval shape.

As illustrated in FIGS. 1 and 3, a plurality of (in the embodiment, two) shield member fixing parts 12 are formed. The shield member fixing part 12 is formed to face long side portions 13 and 14 of the outer surface 11 of the shield member mounting portion 7. As illustrated in FIG. 2, the shield member fixing part 12 is formed so as to extend in a direction (in FIG. 2, the left-right direction) perpendicular to the axial direction of the shield member mounting portion 7.

The number of shield member fixing parts 12 disposed is not limited to the embodiment. In addition, for example, in addition to the configuration of the embodiment illustrated in FIGS. 2 and 3, a configuration may also be employed in which the shield member fixing part 12 is formed to be disposed to face short side portions 15 and 16 of the outer surface 11 of the shield member mounting portion 7.

In addition, the configuration of the shield member fixing part 12 is not limited to the above-described configuration in which a plurality of shield member fixing parts 12 are formed. In addition, although not illustrated in the drawing, a configuration may also be employed in which the shield member fixing part 12 is formed in the entire area of the outer surface 11 of the shield member mounting portion 7.

As illustrated in FIGS. 1 to 3, the shield member fixing part 12 includes a fastening position aligning portion 17 and an inclined portion 18.

As illustrated in FIGS. 1 to 3, the fastening position aligning portion 17 is formed on a surface of the shield member fixing part 12 on a base end 19 side of the shield member mounting portion 7. Here, the base end 19 corresponds to an end (in FIGS. 1 to 3, a rear end in the front-rear direction) of the shield member mounting portion 7 continuous to a front end of the housing accommodation portion 6. Here, the open end 20 corresponds to an end (in FIGS. 1 to 3, a front end in the front-rear direction) of the shield member mounting portion 7 opposite to the end continuous to the front end of the housing accommodation portion 6.

As illustrated in FIGS. 1 to 3, the fastening position aligning portion 17 is formed as a wall portion that is continuous to the outer surface 11 on the base end 19 side of the shield member mounting portion 7 and extends toward the inside of the shield member mounting portion 7 in a direction perpendicular to the outer surface 11. The fastening position aligning portion 17 is formed so as to align a fastening position of the binding member 5 illustrated in FIG. 1.

As illustrated in FIG. 1, the fastening position aligning portion 17 is formed at a height at which, even in a case where the binding member 5 tries to move toward the base end 19 side of the shield member mounting portion 7, an end of the binding member 5 can be in contact with the fastening position aligning portion 17.

In the embodiment, as illustrated in FIG. 1, the fastening position aligning portion 17 is formed at a height that is substantially the same as the height of the shield member 4 and the binding member 5 in the thickness direction in a case where the shield member 4 is mounted on the shield member mounting portion 7 by fastening of the binding member 5. However, the configuration of the fastening position aligning portion 17 is limited to the above-described configuration. In addition, the fastening position aligning portion 17 may be formed at a height that is higher than the height of the shield member 4 and the binding member 5 in the thickness direction in a case where the shield member 4 is mounted on the shield member mounting portion 7 by fastening of the binding member 5.

By setting the height of the fastening position aligning portion 17 as described above, even in a case where the binding member 5 tries to move toward the base end 19 side of the shield member mounting portion 7 by vibration or the like being applied thereto, the end of the binding member 5 is in contact with the fastening position aligning portion 17. As a result, even in a case where the binding member 5 tries to move toward the base end 19 side, the fastening position aligning portion 17 maintains the state where the binding member 5 is fastened to the fastening position.

As illustrated in FIGS. 1 to 3, the inclined portion 18 is formed to be continuous to the fastening position aligning portion 17 and to extend up to a substantially intermediate portion in the axial direction of the shield member mounting portion 7. The inclined portion 18 may be formed to extend up to the open end 20 of the shield member mounting portion 7.

As illustrated in FIGS. 1 to 3, the inclined portion 18 is formed in an inclined shape in which a cross-section taken along the axial direction of the shield member mounting portion 7 extends outwards from the base end 19 side of the shield member mounting portion 7 toward the open end 20 side of the shield member mounting portion 7.

By forming the inclined portion 18 in the above-described shape, as illustrated in FIGS. 1 to 3, the outer diameter of the inclined portion 18 gradually increases from the base end 19 side toward the open end 20 side of the shield member mounting portion 7.

As illustrated in FIGS. 1 to 3, the inclined portion 18 includes a minimum outer diameter portion 21, a maximum outer diameter portion 22, and a substantially intermediate portion 23. The minimum outer diameter portion 21 is formed to have the minimum outer diameter in the inclined portion 18. The maximum outer diameter portion 22 is formed to have the maximum outer diameter in the inclined portion 18. The substantially intermediate portion 23 is formed to connect the minimum outer diameter portion 21 and the maximum outer diameter portion 22 to each other.

As illustrated in FIGS. 1 to 3, the inclined portion 18 is formed in a curved shape in which a cross-section taken along the axial direction of the shield member mounting portion 7 is downwardly convex. The cross-sectional shape of the inclined portion 18 is not limited to the above-described shape. In addition, the inclined portion 18 may be formed to be linearly inclined (the details of other shapes can be found in a modification example described below).

Next, the housing will be described. Although not illustrated in the drawing, the housing is formed of an insulating synthetic resin material, and is formed so as to be accommodated in the housing accommodation portion 6 of the shield shell 3. The housing is formed such that the conduction path with terminals (not illustrated) can be accommodated therein.

Next, the conduction path with terminals will be described. Although not illustrated in the drawing, terminal fittings are connected to the terminals of the conduction path (for example, an electric wire, a cable and so on).

Next, the shield member 4 will be described. As illustrated in FIG. 1, the shield member 4 is a cylindrical member for shielding electromagnetic waves (shield member for shielding electromagnetic waves), and is formed in a shape in which the shield member 4 can cover the entire area of a conduction path constituting the conduction path with terminals. In the embodiment, the shield member 4 is a braid that is formed by braiding conductive thin wires in a cylindrical shape.

In the embodiment, as described above, a braid is adopted as the shield member 4. However, the shield member 4 is not limited to a braid as long as it can shield electromagnetic waves. In addition, for example, a conductive metal foil or a member including the metal foil may be adopted.

Next, the binding member 5 will be described. As illustrated in FIG. 1, the binding member 5 is a member for fastening the shield member 4 covering the shield member mounting portion 7. Specific examples of the binding member 5 include Ty-Rap (registered trade name, manufactured by Thomas&Betts), INSULOK (registered trade name, manufactured by Hellermann Tyton Co., Ltd.), and the like. As the binding member 5, in addition to the above-described examples, a crimp ring may be adopted.

Next, the procedure of an assembly operation of the shield connector 1 will be described. First, although not illustrated in the drawing, the conduction path with terminals is accommodated in the housing. Next, the housing is accommodated in the housing accommodation portion 6 therein of the shield shell 3 illustrated in FIGS. 2 and 3.

Next, the shield member mounting portion 7 is covered with the shield member 4, and the outer side of the shield member 4 covering the shield member mounting portion 7 is fastened by the binding member 5. At this time, as illustrated in FIG. 1, the binding member 5 is disposed in the minimum outer diameter portion 21 of the inclined portion 18 in the shield member fixing part 12. As a result, the shield member 4 and the shield member mounting portion 7 are fastened by the binding member 5, and the shield member 4 is connected and fixed to the shield member mounting portion 7. This way, the assembly operation of the shield connector 1 is completed.

Next, the procedure of a mounting operation of the shield connector 1 on the case 2 will be described. First, a part of the shield connector 1 illustrated in FIG. 1 is inserted into an insertion hole (not illustrated) formed in the case 2, and a rear end of the shield shell 3 comes into surface contact with the case 2. Next, a bolt (not illustrated) is inserted into the bolt insertion hole 10 (refer to FIG. 2) of the shell fixing portion 9, and this bolt is screwed into a bolt screw hole (not illustrated) formed in the case 2. As a result, the shield connector 1 is fixed to the case 2. This way, the mounting operation of the shield connector 1 on the case 2 is completed.

Next, in a case where the shield member 4 is pulled in a direction (hereinafter, referred to as "separation direction") in which the shield member 4 is separated from the shield member mounting portion 7, an action of the shield connector 1 adopting the shield shell 3 will be described with reference to FIG. 4.

As illustrated in FIG. 4, the inclined portion 18 is formed such that the outer diameter increases from the base end 19 side of the shield member mounting portion 7 toward the open end 20 side of the shield member mounting portion 7. Therefore, even in a case where the shield member 4 is pulled in the separation direction (direction indicated by arrow A in FIG. 4) in a state where the binding member 5 is fastened to the minimum outer diameter portion 21 side, the binding member 5 does not exceed the maximum outer diameter portion 22. As a result, even in a case where the shield member 4 is pulled in the separation direction (direction indicated by arrow A in FIG. 4), the state where the shield member 4 is held in the shield member mounting portion 7 is maintained.

In addition, as illustrated in FIG. 4, even in a case where the shield member 4 is pulled in the separation direction, the binding member 5 tries to rise to the maximum outer diameter portion 22 side of the inclined portion 18. Therefore, as the shield member 4 is pulled in the separation direction, a force with which the shield member 4 is fastened by the binding member 5 increases.

In addition, as illustrated in FIG. 4, the shield member fixing parts 12 are provided in the pair of long side portions 13 and 14, respectively. Therefore, the force with which the shield member 4 is held in the shield member mounting portion 7 is higher than that, for example, in a case where the shield member fixing part 12 is disposed only in the single long side portion 13 (14) of the shield member mounting portion 7. Accordingly, even in a case where the shield member 4 is pulled in the separation direction, the state where the shield member 4 is held in the shield member mounting portion 7 is more reliably maintained.

Further, as illustrated in FIG. 4, the inclined portion 18 is formed in a curved shape that is downwardly convex. Therefore, even in the substantially intermediate portion 23, a difference in outer diameter from the maximum outer diameter portion 22 increases as compared to an inclined shape that is formed linearly. As a result, even in a case where the shield member 4 is pulled in the separation direction, the binding member 5 is less likely to exceed the maximum outer diameter portion 22. Thus, the state where the shield member 4 is held in the shield member mounting portion 7 is more reliably maintained.

Figure 5:
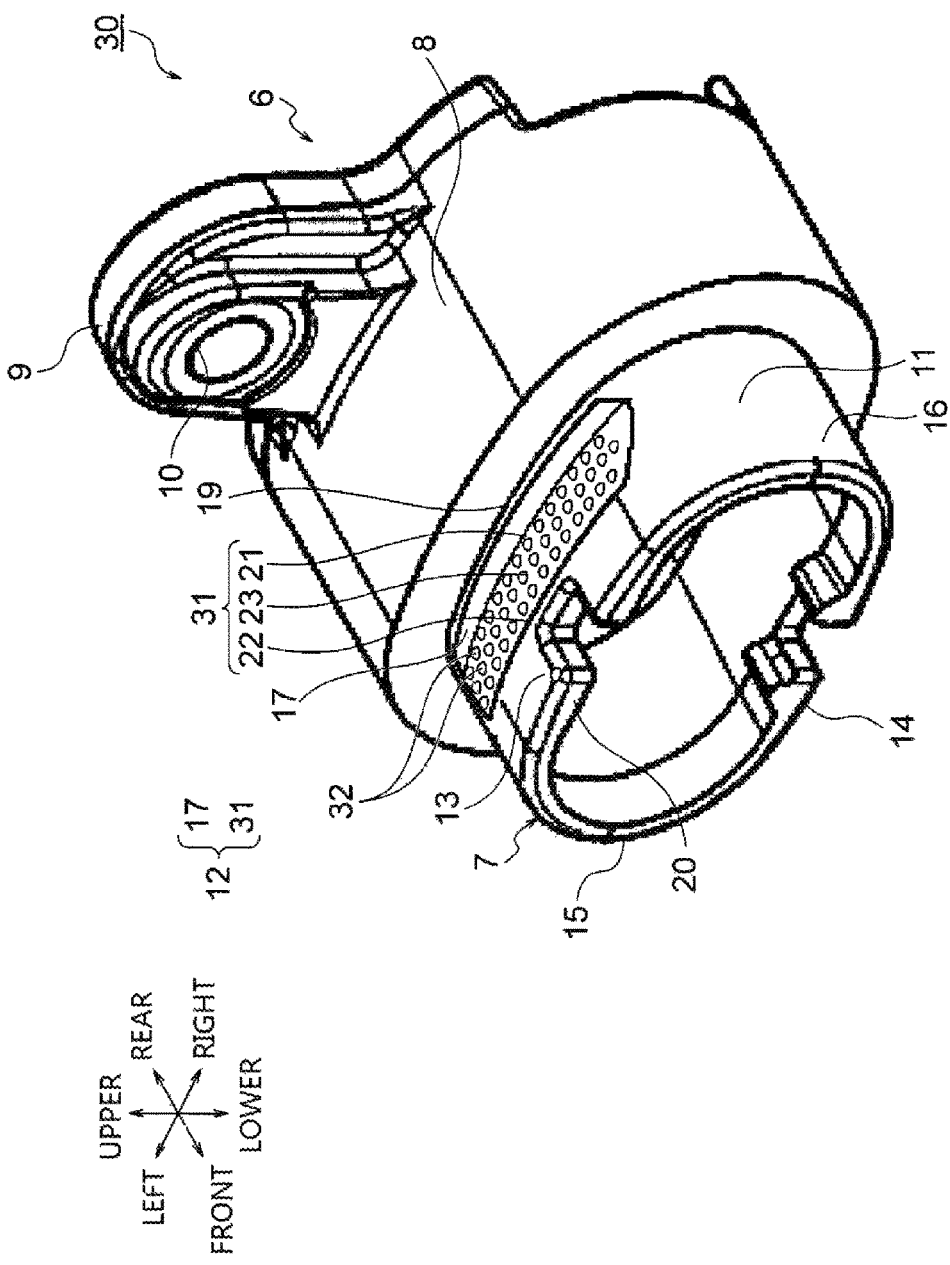
FIG. 5 is a perspective view illustrating a modification example of the shield shell.

The shield shell 3 according to the above-described embodiment may be replaced with a modification example illustrated in FIG. 5. Hereinafter, the modification example will be described with reference to FIG. 5. FIG. 5 is a perspective view illustrating the modification example of the shield shell.

In a shield shell 30 illustrated in FIG. 5, a plurality of protrusion portions 32 are formed in the inclined portion 31. The protrusion portions 32 are formed in a dimpled shape as illustrated in FIG. 5. By forming the protrusion portions 32, the inclined portion 31 is formed in a shape in which unevenness is imparted to the surface.

In the shield shell 30, since the inclined portion 31 is formed in the above-described shape, a frictional resistance of the surface of the inclined portion 31 increases. Therefore, even in a case where the shield member 4 (refer to FIGS. 1 and 4) is pulled in the separation direction, the binding member 5 (refer to FIGS. 1 and 4) is not likely to move to the maximum outer diameter portion 22 side. Therefore, even in a case where the shield member 4 is pulled in the separation direction, the state where the shield member 4 is held in the shield member mounting portion 7 is maintained.

Instead of the shield shell 30 according to the above-described modification example, a shield shell in which the surface of the inclined portion 18 illustrated in FIG. 2 is "rough" without being treated may be adopted.

Next, an effect of the shield shells 3 or 30 and the shield connector 1 including the shield shell 3 or 30 will be described.

As described above with reference to FIGS. 1 to 5, with the shield shell 3 or 30 and the shield connector 1 including the shield shell 3 or 30, an effect of preventing the shield member 4 from being removed from the shield member mounting portion 7 in a case where the shield member 4 is pulled in the separation direction is exhibited.

In addition, it is obvious that various modifications can be made within a range not departing from the scope of the present invention.

In accordance with embodiments, as shown in the drawings, a shield shell 30 includes a housing accommodation portion 6 and a shield member mounting portion 7. The shield member mounting portion 7 is formed to be continuous to the housing accommodation portion 6. A shield member fixing part 12 is provided on an outer surface of the shield member mounting portion 7. The shield member fixing part 12 has an inclined shape in which a cross-section taken along an axial direction of the shield member mounting portion 7 expands outwards from a base end side of the shield member mounting portion 7 toward an open end side of the shield member mounting portion 7.

In the shield shell, the shield member fixing part is formed in an inclined shape that extends outwards from the base end side of the shield member mounting portion toward the open end side of the shield member mounting portion. Therefore, the outer diameter of the shield member fixing part increases from the base end side of the shield member mounting portion toward the open end side of the shield member mounting portion. Regarding the shield member fixing part having the above-described configuration, in a state where the outer surface of the shield member mounting portion is covered with the shield member, the binding member is fastened so as to match the outer diameter of the shield member mounting portion on the base end side of the shield member mounting portion. As a result, the binding member does not exceed the portion of the shield member fixing part on the open end side of the shield member mounting portion. Thus, even in a case where the shield member is pulled in a direction hereinafter, referred to as "separation direction" in which the shield member is separated from the shield member mounting portion, the state where the shield member is held in the shield member mounting portion is maintained.

In addition, the outer diameter of the shield member fixing part increases from the base end side of the shield member mounting portion toward the open end side of the shield member mounting portion. Therefore, in a case where the shield member is pulled in the separation direction, the binding member tries to rise to the open end side of the shield member fixing part. As a result, as the shield member is pulled in the separation direction, a force with which the shield member is fastened by the binding member increases.

In accordance with the embodiments, the shield member mounting portion 7 may have a cross-section taken along a direction perpendicular to the axial direction of the shield member mounting portion 7 in an elliptical shape or an oval shape. A plurality of the shield member fixing parts 12 may be provided on the outer surface of the shield member mounting portion 7. At least one of the plurality of the shield member fixing parts 12 may be disposed on a long side portion 13, 14 of the shield member mounting portion 7.

In the shield shell having the above-described characteristics, the shield member fixing part is disposed to face the long side portions of the shield member mounting portion and thus is disposed in each of the pair of long side portions. Therefore, the force with which the shield member is held in the shield member mounting portion is higher than that, for example, in a case where the shield member fixing part is disposed only in the single long side portion of the shield member mounting portion. Accordingly, even in a case where the shield member is pulled in the separation direction, the state where the shield member is held in the shield member mounting portion is more reliably maintained.

In accordance with the embodiments, the shield member fixing part 12 may have a curved shape in which a cross-section taken along the axial direction of the shield member mounting portion is downwardly convex.

In the shield shell, the shield member fixing part is formed in a curved shape that is downwardly convex. Therefore, even in the substantially intermediate portion of the shield member fixing part, a difference in outer diameter from the open end side of the shield member fixing part increases as compared to an inclined shape that is formed linearly. As a result, even in a case where the shield member is pulled in the separation direction, the binding member is less likely to exceed the portion of the shield member fixing part on the open end side of the shield member mounting portion. Thus, the state where the shield member is held in the shield member mounting portion is more reliably maintained.

In accordance with embodiments, a shield connector includes the shield shell 30, the housing that is accommodated in the shield shell 30, a conduction path with a terminal that is accommodated in the housing, and the shield member 4 that is mounted on the shield member mounting portion 7 of the shield shell 30 by fastening of the binding member 5. The shield shell 30 includes a housing accommodation portion 6 and a shield member mounting portion 7. The shield member mounting portion 7 is formed to be continuous to the housing accommodation portion 6. A shield member fixing part 12 is provided on an outer surface of the shield member mounting portion 7. The shield member fixing part 12 has an inclined shape in which a cross-section taken along an axial direction of the shield member mounting portion 7 expands outwards from a base end side of the shield member mounting portion 7 toward an open end side of the shield member mounting portion 7.

According to the shield shell and the shield connector, the shield member would be prevented from being removed from the shield member mounting portion when the shield member is pulled in the separation direction.

What is claimed is:
1. A shield shell comprising:
 a housing accommodation portion including a shell fixing portion to be fixed to a mounting target portion which is electrically conductive; and a shield member mounting portion which is formed to be continuous to the housing accommodation portion and on which a shield member is to be mounted by fastening of a binding member, wherein the shield member mounting portion includes at least one shield member fixing part provided on an outer surface of the shield member mounting portion, wherein the shield member fixing part has an inclined shape in which a cross-section taken along an axial direction of the shield member mounting portion expands outwards from a base end side of the shield member mounting portion toward an open end side of the shield member mounting portion, and wherein the shield member fixing part is to be fastened by the binding member.

2. The shield shell according to claim 1, wherein the shield member mounting portion has a cross-section taken along a direction perpendicular to the axial direction of the shield member mounting portion in an elliptical shape or an oval shape, wherein a plurality of the shield member fixing parts are provided on the outer surface of the shield member mounting portion, and wherein at least one of the plurality of the shield member fixing parts is disposed on a long side portion of the shield member mounting portion.

3. The shield shell according to claim 1, wherein the shield member fixing part has a curved shape in which a cross-section taken along the axial direction of the shield member mounting portion is downwardly convex.

4. A shield connector comprising:
a shield member;
a shield shell;
a housing that is accommodated in the shield shell;
a conduction path with a terminal that is accommodated in the housing; and
a binding member,
wherein the shield shell includes:

a housing accommodation portion including a shell fixing portion to be fixed to a mounting target portion which is electrically conductive; and a shield member mounting portion which is formed to be continuous to the housing accommodation portion and on which a shield member is to be mounted by fastening of the binding member, wherein the shield member mounting portion includes at least one shield member fixing part provided on an outer surface of the shield member mounting portion, and wherein the shield member is mounted on the shield member fixing part by the binding member, and wherein the shield member fixing part has an inclined shape in which a cross-section taken along an axial direction of the shield member mounting portion expands outwards from a base end side of the shield member mounting portion toward an open end side of the shield member mounting portion.

5. The shield shell according to claim 1, wherein the shield member fixing part has a maximum outer diameter portion, a minimum outer diameter portion, and an intermediate portion disposed between the maximum and minimum outer diameter portions.

6. The shield shell according to claim 5, wherein the minimum outer diameter portion houses the binding member.

7. The shield shell according to claim 1, wherein a fastening position aligning portion is formed on both the outer surface of the shield member fixing part and on the base end side of the shield member mounting portion.

8. The shield shell according to claim 7, wherein a fastening position aligning portion is adjacent to the binding member.

9. The shield connector according to claim 4, wherein the shield member includes a cylindrical braid.

10. The shield connector according to claim 4, wherein the binding member includes a binding band or a crimp ring.

* * * * *